(12) United States Patent
Sano et al.

(10) Patent No.: US 6,458,715 B2
(45) Date of Patent: Oct. 1, 2002

(54) PROCESS OF MANUFACTURING SEMICONDUCTOR DEVICE

(75) Inventors: Naoki Sano; Masaki Hara; Mitsunobu Sekiya; Toshiyuki Sameshima, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/779,766

(22) Filed: Feb. 8, 2001

Related U.S. Application Data

(62) Division of application No. 08/515,068, filed on Aug. 14, 1995.

(30) Foreign Application Priority Data

Aug. 15, 1994 (JP) .......................................... 6-191628

(51) Int. Cl.[7] .......................................... H01L 21/265
(52) U.S. Cl. ........................... 438/773; 438/96; 438/97; 438/151; 438/162; 438/769; 438/795; 438/909
(58) Field of Search ........................... 438/96, 97, 151, 438/162, 769, 773, 795, 909

(56) References Cited

U.S. PATENT DOCUMENTS

| | | |
|---|---|---|
| 4,525,593 A | 6/1985 | Yablonovitch |
| 4,725,560 A | 2/1988 | Abernathey et al. |
| 4,784,975 A | 11/1988 | Hofmann et al. |
| 5,262,360 A | 11/1993 | Holonyak et al. |
| 5,620,932 A | 4/1997 | Fujimaki |

FOREIGN PATENT DOCUMENTS

| | | |
|---|---|---|
| JP | 5522862 | 2/1980 |
| JP | 5522863 | 2/1980 |
| JP | 422127 | 1/1992 |
| JP | 5275419 | 10/1993 |
| JP | 661323 | 3/1994 |

OTHER PUBLICATIONS

N. Sano, et al., IEEE Electron Dev. Lett. 16(5)(1995)157 "High quality SiO2/Si . . . by annealing in wet atmosphere".
N.D. Young et al., Semicond. Sci. Technol. 7(1992)1103 "Water–related instability in TFTs formed using deposited gate oxides".
A. A. Bergh et al., J. Electrochem. Soc. 115(12)(1968)1282 The effect of heat–treatment on transistor . . . :
F. Montillo, et al., J. Electrochem. Soc. 118(9)(1971)1463 "High temperature annealing of oxidized silicon surfaces".
S.C. Kim et al., MRS Proc. 336(1994)775 "Effects of N2 plasma on SiO2 . . . TFT".
R.C. Dockerty et al., IEEE Trans. Electron Dev. 22(2)1975)33 "Low leakage . . . FET's ".
M. Morita et al., Appl. Phys. Lett. 55(6)(1989)562 "Control factor of native oxide. . . in air or ultrapure water".
S.C. Loi et al., J. Appl. Phys. 72(9)(1992)4214 "Electrical characteristics . . . SiO2 film: effect of water treatment".

*Primary Examiner*—Charles Bowers
*Assistant Examiner*—Lisa Kilday
(74) *Attorney, Agent, or Firm*—Sonnenschein, Nath & Rosenthal

(57) ABSTRACT

A target semiconductor device can be obtained stably by reforming an insulating film and a semiconductor. In a process of manufacturing a semiconductor device, at least one of the semiconductor and the insulating film is reformed after an annealing process for annealing the semiconductor at a temperature ranging from 20 to 400° C. in the atmosphere containing a gas of water ($H_2O$) with a partial pressure from 1 Torr to a saturated vapor pressure for an annealing time ranging from 15 seconds to 20 hours.

1 Claim, 9 Drawing Sheets

PROCESS OF MANUFACTURING SEMICONDUCTOR DEVICE

This application is a divisional of application Ser. No. 08/515,068, filed Aug. 14, 1995.

BACKGROUND OF THE INVENTION

The present invention relates to a process of manufacturing a semiconductor device.

Liquid crystal display devices of active-matrix type use a so-called thin film transistor (TFT) wherein an insulating-gate field effect transistor (MIS (metal-insulator-semiconductor) transistor) is fabricated on a thin film semiconductor layer as a switching device. Inasmuch as the TFT is formed on a substrate made of a proper material, such as a borosilicate glass or plastic substrate having a low melting point or low heat-resisting property, the TFT, accordingly, the gate insulating film thereof is formed at a low temperature. The gate insulating film is formed by plasma CVD (chemical vapor deposition) wherein a substrate temperature used when the insulating gate film is formed ranges from 600 to 300° C.

As is well-known, if a film-forming temperature, i.e., substrate temperature is lowered when the gate insulating film is formed, then it becomes difficult to obtain a MIS transistor having a desired characteristic.

For example, an n-channel MIS transistor is operated in a depletion-type transistor. Moreover, a p-channel MIS transistor has a problem that a threshold voltage $v_{th}$ increases so that the p-channel MIS transistor cannot be energized even on application of a predetermined negative voltage. Thus, a circuit using an n-channel or p-channel MIS transistor cannot be formed as an integrated circuit satisfactorily.

This phenomenon occurs due to a positive electric charge caused by a defect in atomic bonding or impurity in the gate insulating film. The positive electric charge is caused by a so-called dangling bond of Si (silicon) of $SiO_2$, for example. When the positive electric charge exists near the interface between the gate insulating film and the semiconductor, a flat-band voltage is shifted (moved), resulting in the n-channel MIS transistor being operated in the depletion type transistor or the ON-voltage of the p-channel MIS transistor being increased.

When an operation voltage of the MIS transistor is relatively large, e.g., about ±20V, a flat-band voltage shift of about +4V is allowable. However, this flat-band voltage shift becomes fatal to an increasing demand in which the MIS transistor can be driven by a low voltage, e.g., ±5V.

As a method of solving the aforesaid problem, there is proposed a post-anneal wherein a defect can be compensated by heat treatment in an oxygen atmosphere such as the air after the gate insulating film has been formed. The post-anneal (including a hydrogen plasma treatment) might be a reducing anneal containing hydrogen gas, an air anneal or the like. The reducing anneal needs an annealing at a high temperature in excess of 400° C. According to any one of these anneals, a flat-band voltage shift increases depending on a film quality of the insulating film. Then, effects of the air anneal are fluctuated depending on the season, which brings about a problem in actual practice.

SUMMARY OF THE INVENTION

In view of the aforesaid aspect, it is an object of the present invention to provide a process of manufacturing a semiconductor device in which a quality of semiconductor can be improved and a desired semiconductor device can be obtained stably.

It is another object of the present invention to provide a process of manufacturing a semiconductor device in which the above-mentioned flat-band shift can be improved.

According to an aspect of the present invention, there is provided a process of manufacturing a semiconductor device. The manufacturing process comprises the steps of annealing a semiconductor at a temperature ranging from 20 to 400° C. in the atmosphere containing a gas of water with a partial pressure ranging from 1 Torr to a saturated vapor pressure for an annealing time from 15 seconds to 20 hours, and reforming at least one of the semiconductor or an insulating film.

DETAILED DESCRIPTION OF THE PREFERRED EMBODIMENT

The present invention will now be described with reference to the drawings.

In a manufacturing method according to the present invention, after a semiconductor device, e.g., MIS transistor wherein a target semiconductor device, e.g., all assembly portions such as electrodes forming the MIS transistor are formed on a semiconductor substrate has been formed, the semiconductor device is annealed, e.g., by vapor annealing for a time period longer than 15 seconds and shorter than 20 hours in the atmosphere including gas of water with a partial pressure higher than 1 Torr and lower than saturated vapor pressure at a temperature ranging from 20 to 400° C.

In this embodiment, a semiconductor substrate refers to not only a bulk-type substrate which is wholly formed of a semiconductor but also substrates wherein a single crystal semiconductor layer, a polycrystalline semiconductor layer and an amorphous semiconductor layer are formed on an insulating or semi-insulating substrate.

The vapor annealing is effective for the MIS transistor manufactured in the whole process wherein a substrate temperature is 600° C. or lower. Specifically, as mentioned before, the MIS transistor wherein the gate insulating film, for example, was formed at a substrate temperature lower than 600° C., e.g., at a substrate temperature ranging from 600 to 300° C. is inferior in characteristics. When the MIS transistor is annealed at a temperature exceeding 600° C. after the gate insulating film has been formed, the insulating film can be reformed and the ohmic-contact property can be improved by hightemperature annealing which contains no water.

Figure 1:
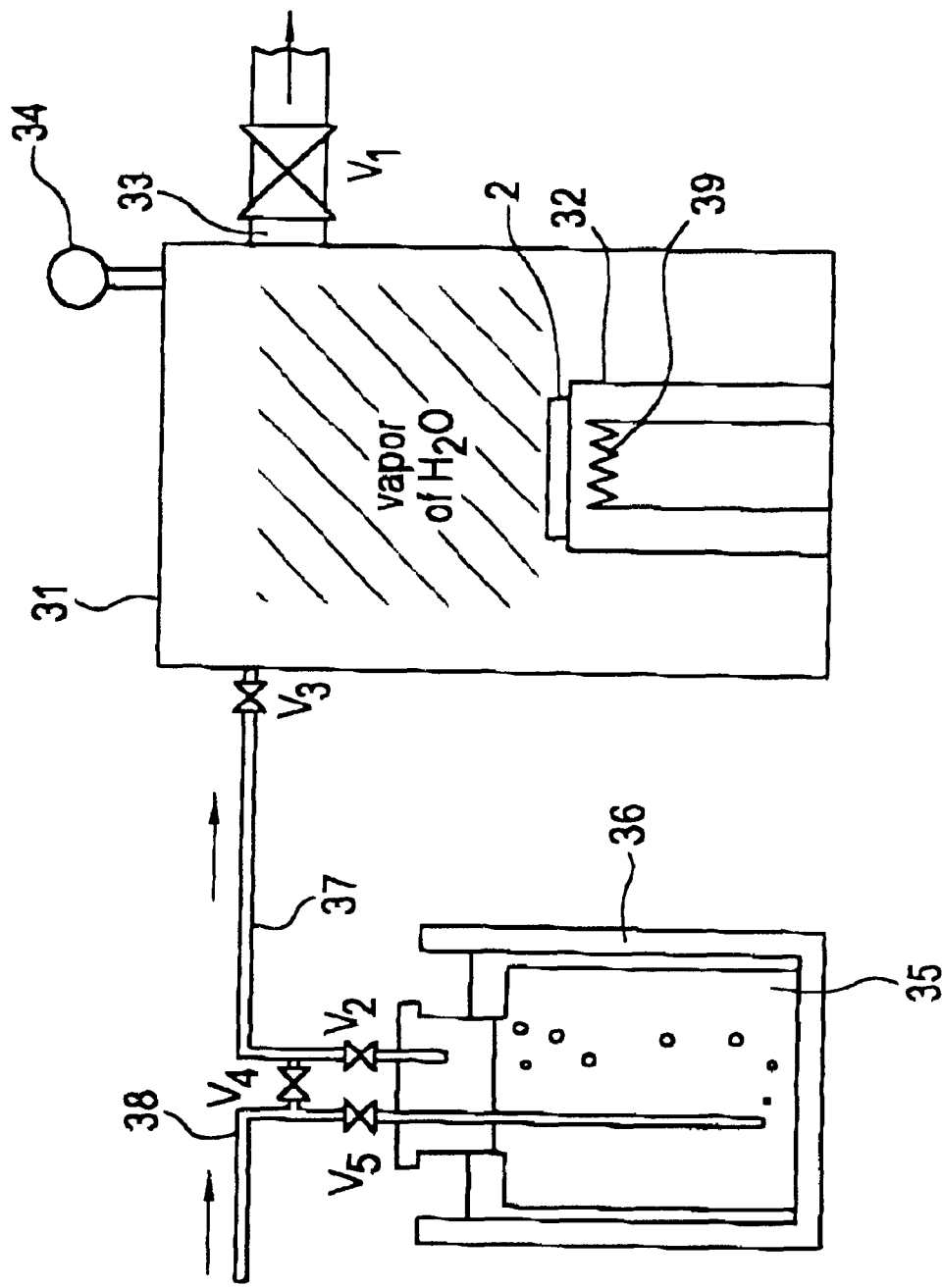
FIG. 1 is a schematic diagram showing an arrangement of an example of an apparatus used in an annealing wherein an inventive manufacturing process is carried out.

FIG. 1 of the accompanying drawings shows an example of an apparatus for carrying out the above-mentioned vapor annealing. As shown in FIG. 1, a substrate holder 32 for holding thereon a semiconductor substrate 2 is disposed within a substrate annealing container 31. The substrate holder 32 includes a heating means 39 such as an electric heater to heat the semiconductor substrate 2 held thereon up to a predetermined temperature.

The substrate annealing container 31 includes an exhaust slot 33 coupled through a valve $V_1$ to an exhausting means (not shown). The substrate annealing container 31 is provided with a pressure gauge 34 for observing a pressure in the inside thereof.

A constant temperature oven 36 includes a container portion 35 which contains water ($H_2O$). The container portion 35 is coupled to the substrate annealing container 31 through a coupling tube 37 having valves $V_2$ and $V_3$. A carrier gas supply tube 38 through which a carrier gas is supplied is coupled between the valves $V_2$ and $V_3$ through a valve $V_4$. The carrier gas supply tube 38 is further coupled through a valve $V_5$ to the water container portion 35 provided within the constant temperature oven 36.

A vapor of a predetermined amount set by a saturated vapor pressure under a heating temperature set by the constant temperature oven 36 is supplied to the substrate annealing container 31, which was evacuated at a high degree of vacuum, in a vacuum suction fashion by opening and closing the valves $V_3$ and $V_4$. The pressure of the container 31 is monitored by the pressure gauge 34. In this case, it is preferable that the substrate annealing container 31 is wholly heated at a temperature higher than a dew point relative to the amount of introduced vapor by a heating means (not shown) disposed in the substrate annealing container 31 so that the vapor supplied to the substrate annealing container 31 may not form a moisture.

The insulating film, in particular, the gate insulating film should preferably be formed by plasma process, particularly, remote plasma CVD (chemical vapor deposition) when the semiconductor device, e.g., MIS diode, MIS transistor device or the like is formed on the semiconductor substrate 2. As a remote plasma CVD apparatus, there can be used a remote plasma CVD apparatus proposed by the same assignee of this application (see Japanese laid-open patent publication No. 05-21393) wherein a mesh-shaped electrode is disposed between a plasma generating portion and a semiconductor substrate arrangement portion to block plasma so as to radiate the semiconductor substrate with atomic seeds or molecular seeds excited to be neutral electrically.

According to the remote plasma CVD apparatus, a damage on the surface of the semiconductor substrate, accordingly, the interface between the semiconductor substrate and the gate insulating film formed on the semiconductor substrate can be reduced and the interface state can be made small. Also, it is possible to suppress the occurrence of positive electric charge due to the above-mentioned dangling bond.

Figure 2:
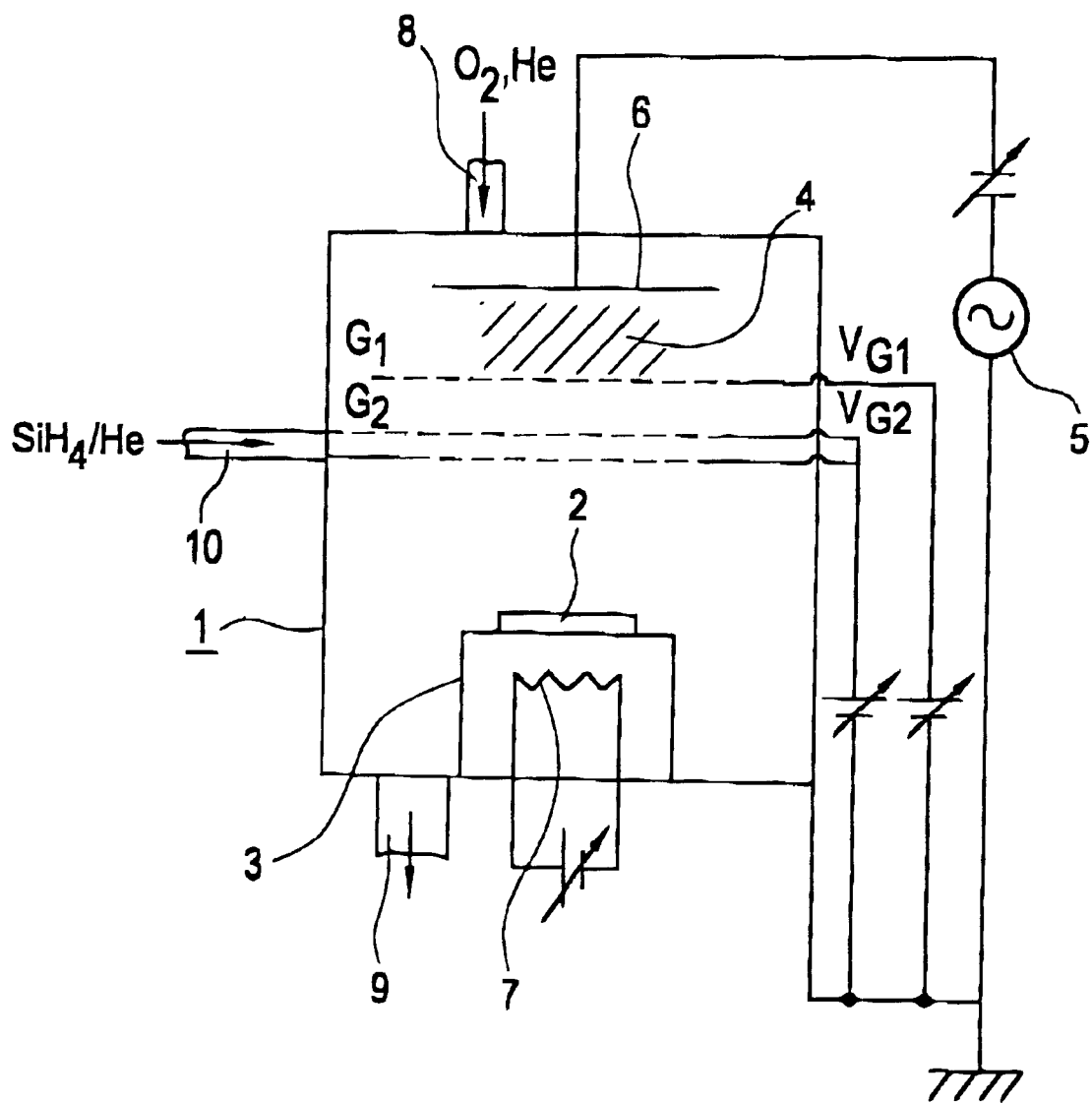
FIG. 2 is a schematic diagram showing an arrangement of an example of a remote plasm CVD apparatus wherein the inventive manufacturing process is carried out.

An example of the remote plasma CVD apparatus will be described below with reference to FIG. 2. FIG. 2 is a schematic diagram showing an arrangement of the remote plasma CVD apparatus. While an electrode of the remote plasma CVD apparatus is formed as a parallel-flat plate type according to the present invention, the present invention is not limited thereto and can be modified variously.

In this embodiment, as shown in FIG. 2, the remote plasma CVD apparatus includes a chamber 1 wherein a plasma generating portion 4 is opposed to a substrate holding portion 3 for holding thereon the semiconductor substrate 2 on which a gate insulating film is formed. The plasma generating portion 4 includes a flat plate-shaped RF (radio frequency) electrode 6 which is applied with a high frequency electric power of 13.56 MHz, for example, from a high frequency (RF) generator 5. First and second mesh-shaped electrodes $G_1$ and $G_2$ are disposed in an opposing relation to the RF electrode 6. The first electrode $G_1$ is formed of a flat plate-shaped mesh electrode and the second electrode $G_2$ is formed of a flat plate bag-shaped mesh electrode. Predetermined voltages $V_{G1}$ and $V_{G2}$ are applied to the first and second electrodes $G_1$ and $G_2$.

The semiconductor substrate holding portion 3 for holding thereon the semiconductor substrate 2 includes a heating means 7 to set the semiconductor substrate 2 at a desired substrate temperature.

The chamber 1 includes a gas introducing slot 8 formed near the plasma generating portion 4 and also includes an exhausting slot 9 formed near the semiconductor substrate holding portion 3. The mesh electrode $G_2$ includes a gas introducing slot 10. Oxygen $O_2$ and helium He are supplied from the gas introducing slot 8 into the chamber 1 and monosilane SiH and helium He are supplied from the gas introducing slot 10 into the chamber 1.

The plasma generating portion 4 is energized to discharge plasma in the space between the RF electrode 6 and the semiconductor substrate holding portion 3 on application of RF electric power. In this case, since the mesh electrodes $G_1$ and $G_2$ are provided between the RF electrode 6 and the semiconductor substrate holding portion 3, the plasma generated by discharge when the predetermined positive voltages $V_{G1}$ and $V_{G2}$ are applied to the semiconductor substrate holding portion 3 is limited to the RF electrode 6 side by the mesh electrodes $G_1$ and $G_2$. Specifically, the semiconductor substrate holding portion 3 is blocked from charged particles of electrons and positive and negative ions. In this way, only neutral radicals, i.e., electrically neutral excited atomic seeds or excited molecular seeds are radiated on the semiconductor substrate 2 held on the semiconductor substrate holding portion 3 to thereby form an $SiO_2$ gate insulating film such that the film forming surface of the semiconductor substrate 2 and the film formed on the above film-forming surface are protected from being damaged by the charged particles.

Since an electron density in the plasma is substantially proportional to a high frequency electric power, in order to suppress a damage on the substrate surface much more, it is desirable that a high frequency electric power applied to the electrodes $G_1$ and $G_2$ can be lowered as much as possible so long as the discharge can be maintained.

Since an electrically neutral precursor $SiO_x^*$ generated in the gas phase is fundamentally accumulated on the film-forming surface of the semiconductor substrate 2, a film-forming speed is substantially the same as the normal plasma CVD different from the remote plasma CVD even when the charged particles are blocked by the mesh electrodes $G_1$ and $G_2$.

Figure 3:
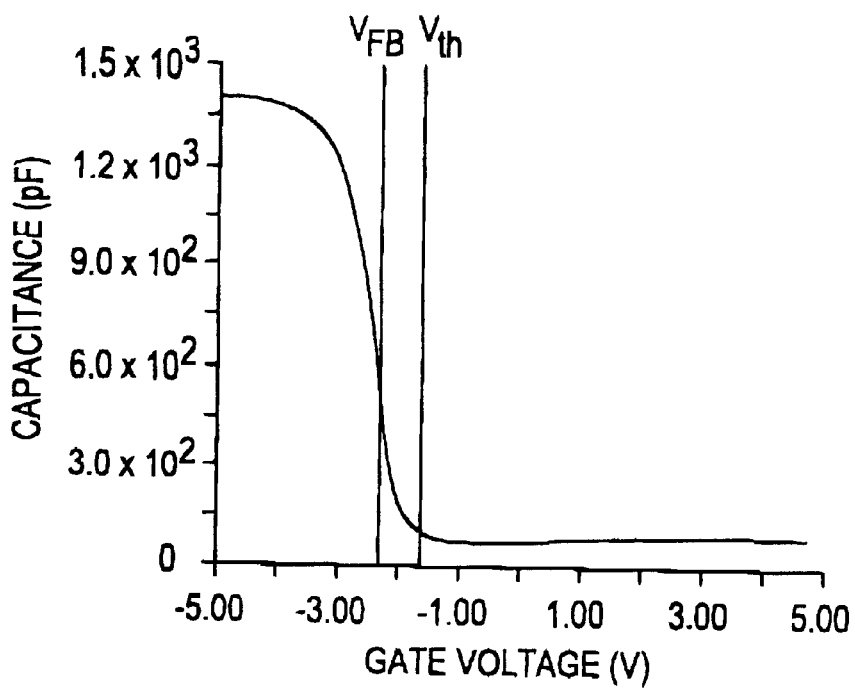
FIG. 3 is a characteristic graph showing measured results of capacitance-gate voltage characteristic of an MIS diode.

A process for manufacturing a semiconductor device according to the present invention will be described concretely. In this case, a p-type single crystal silicon substrate which was doped by boron B at a substrate concentration of $10^{15}$ atoms/$cm^3$ was prepared as the semiconductor substrate 2. An $SiO_2$ gate insulating film having a thickness of 100 nm was formed on the major surface of the p-type single crystal silicon substrate at a substrate temperature of 270° C. by the remote plasma CVD apparatus shown in FIG. 2. Then, a gate electrode of Al (aluminum) deposited film was formed on the $SiO_2$ gate electrode, resulting in an MIS capacitor (MIS diode) being manufactured. FIG. 3 shows measured results of C-V (capacitance versus voltage) characteristic of the MIS diode thus manufactured.

Figure 4:
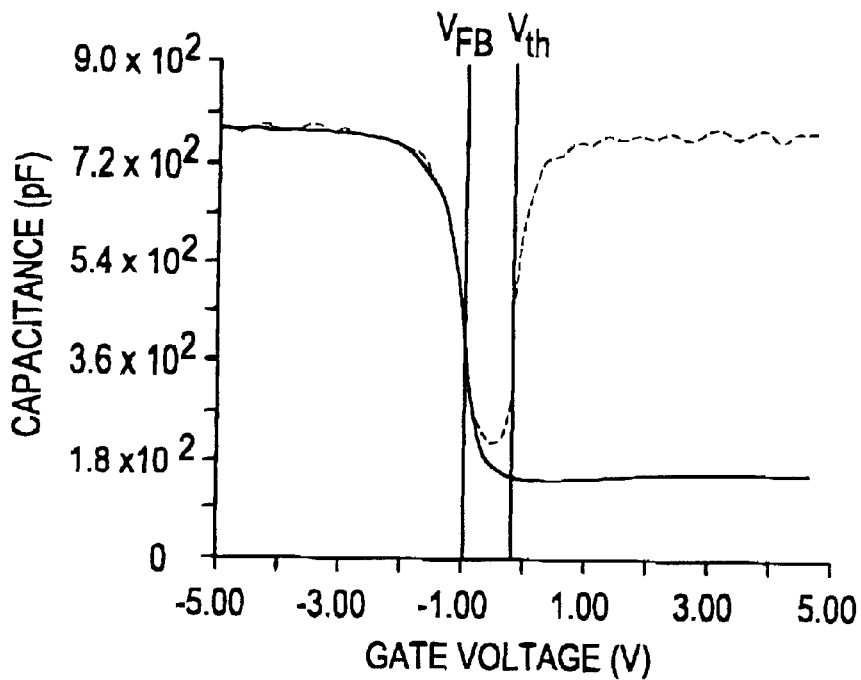
FIG. 4 is a characteristic graph showing measured results of capacitance-gate voltage characteristic obtained when the MIS diode was annealed.

The MIS diode thus formed was held on the semiconductor substrate holder 32 disposed within the substrate annealing container 31, evacuated at a high degree of vacuum, of the annealing apparatus shown in FIG. 1 and annealed, i.e., annealed by vapor anneal for 30 minutes at a substrate temperature of 270° C. by opening the valves $V_2$ and $V_5$ to introduce vapor of 50 Torr into the container 31. FIG. 4 shows measured results of C-V (capacitance versus voltage) characteristics obtained after the MIS diode was annealed.

In the bulk-type MIS (MOS) diode, an electrical capacitance of $SiO_2$ forming the gate insulating film which is not yet annealed was 1401.8 pF and became 800.0 pF after the gate insulating film was annealed. Specifically, the $SiO_2$ film that had an induced dispersion with a high dielectric constant before annealing became a more stabilized film wherein valence bond was alleviated by annealing and had a dielectric constant nearly equal to that of the $SiO_2$ film by thermal oxidation, i.e., an insulating property could be improved. Then, a flat-band voltage $V_{FB}$ was changed from −2.3V to −0.9V and improvements could be made. In this connection, the flat-band voltage $V_{FB}$ obtained when a MIS structure (MOS structure in this embodiment) of a p-type Al gate having a substrate concentration of $10^{15}$ atoms/$cm^3$ was an ideal MIS structure; i.e., the MIS structure has no electric charges of oxide film was −0.89V. Therefore, it is to be appreciated that the above-mentioned improvements are remarkable.

The following equation (1) was used to define an oxide film electric charge density $N_{eff}$:

$$N_{eff}=C_{ox}\cdot(\phi_{MS}-V_{FB})/ES \tag{1}$$

where $C_{ox}$ is the oxide film capacitance obtained from the capacitance versus voltage characteristic (C-V characteristic) of the MOS diode, $V_{FB}$ is the flat-band voltage, $\phi_{MS}$ is the difference between the work function of the gate electrode and the electron affinity of silicon (Si), e is the electric element amount and S is the area of the gate electrode.

Study of FIG. 4 reveals that the oxide film electric charge density $N_{eff}$ was reduced from $1.24\times10^{12}$ $cm^{-2}$ to $5.0\times10^9$ $cm^{-2}$ by annealing.

A characteristic at 0.1 Hz is not shown in FIG. 3 because the dielectric dispersion was large in the state that the gate insulating film was not annealed and thus the above characteristic could not be measured in this mode. By the vapor annealing, as shown in FIG. 4, an interface state density at a silicon mid-gap was obtained from high frequency—quasi-static measured results and then a considerably satisfactory value of $2.0\times10^{10}$ $cm^{-2}$ $eV^{-1}$ was obtained in the MOS (MIS) diode using a low-temperature insulating film.

Figure 5:
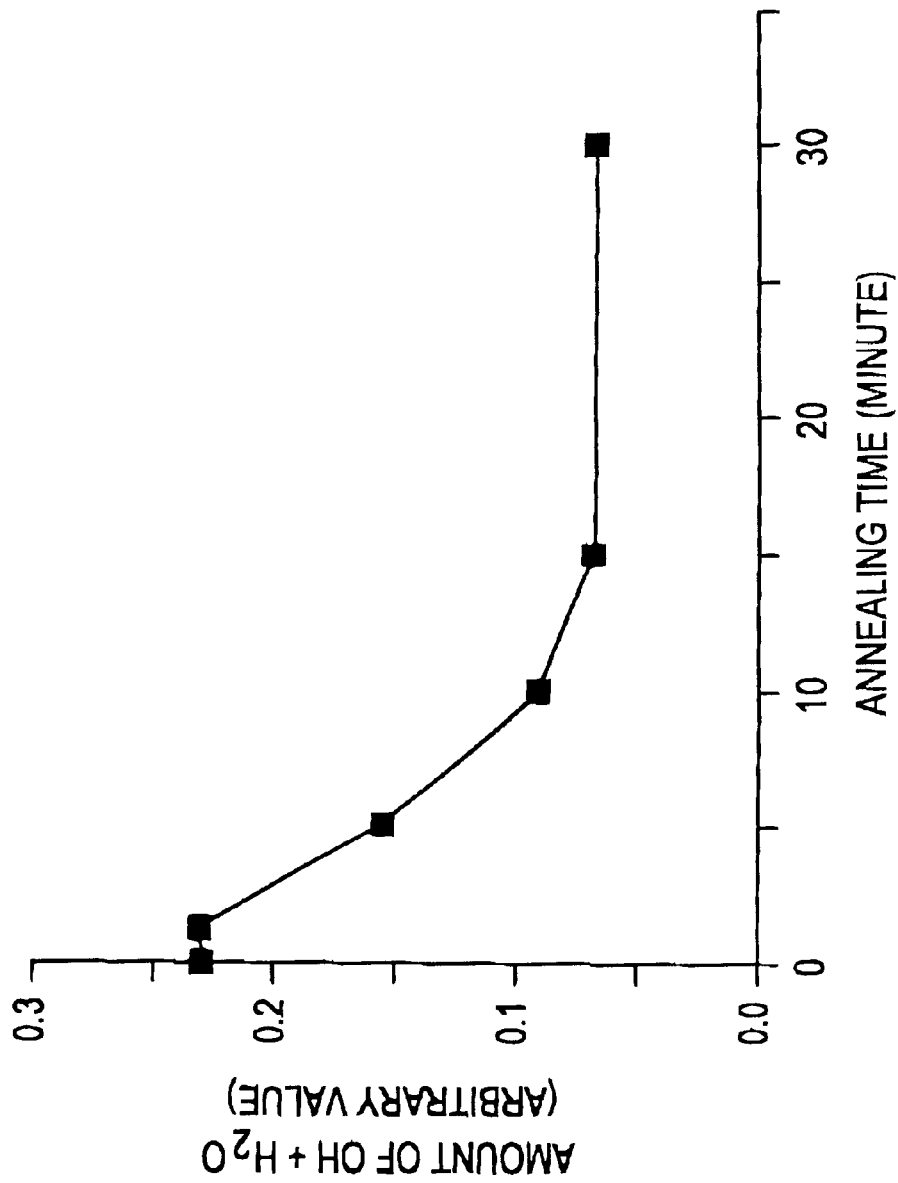
FIG. 5 is a characteristic graph showing measured results obtained when a dependence of an amount of $OH+H_2O$ upon anneal time.

In the case of the vapor annealing according to the present invention, there is then the fear that a water entered into the insulating film to deteriorate a hot carrier will increase. In actual practice, it was confirmed that this annealing can reduce a water or OH radical in the $SiO_2$ film. FIG. 5 is a characteristic graph showing an annealing temperature dependence of $H_2O+OH$ amount (arbitrary unit) calculated from the film by infrared spectroscopy. In that case, the $SiO_2$ film having the film thickness of 100 nm was formed at a film-forming temperature of 270° C. and annealed at a substrate temperature of 270° C. in the vapor pressure of 50 Torr by vapor annealing. Study of FIG. 5 shows that the amount of $H_2O+OH$ in the film was reduced as an annealing time increased.

Also, study of FIG. 5 reveals that the film was reformed as a film having no hygroscopicity by annealing of about 10 minutes or longer. A time required to reform the film can be reduced as an annealing temperature is raised. By way of example, the reforming could be made at an annealing temperature of 400° C. for an annealing time of 20 seconds. Further, in the vapor annealing, the annealing time could be reduced by setting the atmosphere in the RF (high frequency) plasma state. However, an annealing time exceeding 20 hours could not change the reforming effect substantially and therefore an annealing time in excess of 20 hours becomes disadvantageous from an industrial standpoint.

Even when the insulating film contains a water, if this insulating film is annealed in the vacuum atmosphere, then the flat-band voltage shift could not be improved, the dielectric constant could not be stabilized and the hygroscopicity could not be removed.

The reason that the vapor annealing is carried out at a temperature ranging from 20 to 400° C. is that the reforming effect of the insulating film could not be achieved substantially at a temperature less than 20° C. and that a metal electrode or interconnection reacts with a water and changed in quality at a temperature higher than 400° C. An Al (aluminum) which is inexpensive and widely used as an electrode or interconnection becomes a hydrous salt of hydroxide of Al $(OH)_3\cdot nH_2O$ by annealing at a temperature exceeding 400° C. in the vapor.

The reason that the annealing time is selected in a range of from 15 seconds to 20 hours is that the reforming effect cannot be achieved by an annealing time less than 15 seconds. Further, if the annealing time exceeds 20 hours, then the reforming effect is saturated as described before. Therefore, the annealing time longer than 20 hours is not practical from a manufacturing standpoint.

Furthermore, the reason that the vapor partial pressure in the vapor annealing is selected to be higher than 1 Torr and lower than 1 atmospheric pressure is that the vapor partial pressure lower than 1 Torr becomes approximately an amount of vapor contained in the air and affected by the fluctuation of season. Furthermore, the vapor partial pressure lower than 1 atmospheric pressure is practical for an annealing equipment.

While the present invention is applied to the MIS diode (MIS capacitor) as described above, the present invention is not limited thereto and can be applied to the MIS transistor such as the TFT with similar effects being achieved.

An embodiment of the present invention wherein the TFT is manufactured by the inventive manufacturing process will be described below with reference to process diagrams of FIGS. 6 to 10. In this case, the TFT is formed of a polycrystalline silicon.

Figure 6:
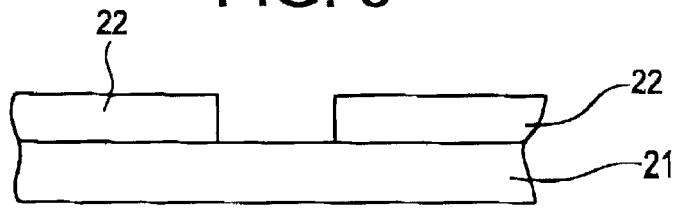
FIGS. 6 through 10 are respectively cross-sectional views used to explain respective processes of a manufacturing method wherein a TFT is manufactured by the manufacturing process according to the present invention.

Initially, as shown in FIG. 6, a first semiconductor layer 22 made of B (boron)-doped amorphous Si (a-Si: H, B) containing hydrogen or P (phosphorus)-doped amorphous Si (a-Si: H, P) containing hydrogen was formed on a glass substrate 21 by CVD. The first semiconductor layer 22 is processed by photolithography such that other portions than the portions of the source region and the drain region of the TFT are etched away.

Figure 7:
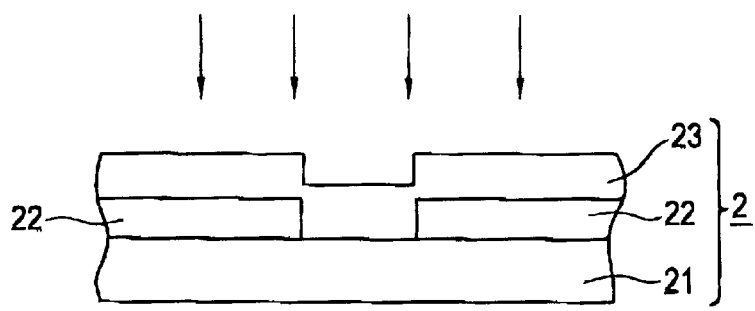

As shown in FIG. 7, on the first semiconductor layer 22, there is formed a second semiconductor layer 23 of a non-doped amorphous Si (a-Si: H) containing hydrogen forming a TFT channel-forming region is formed on the first semiconductor layer 22 by burying the source region and drain region forming portions at its portions in which the semiconductor layer 22 is removed. The semiconductor substrate 2 is formed in this way.

Figure 8:
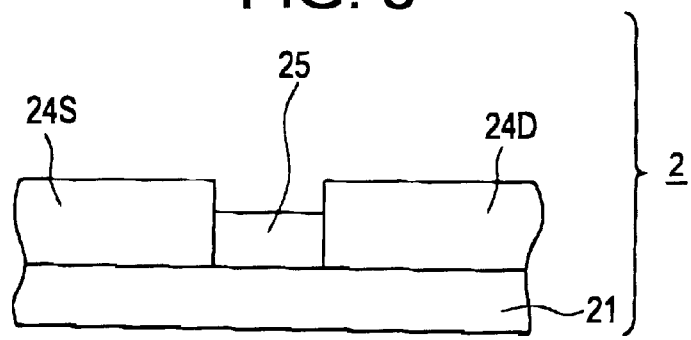

Then, the second semiconductor layer 23 is crystallized by excimer laser annealing which radiates excimer laser beams on the second semiconductor layer 23. Simultaneously, as shown in FIG. 8, an impurity is diffused from the first semiconductor layer 22 to the second semiconductor layer 23 to enable the first semiconductor layer 22 and the second semiconductor layer 23 formed on the first semiconductor layer 22 to constitute a source region 24S and a drain region 24D. A channel-forming region 25 based on the non-doped second semiconductor layer 23 is formed between the source region 24S and the drain region 24D thus formed.

Figure 9:
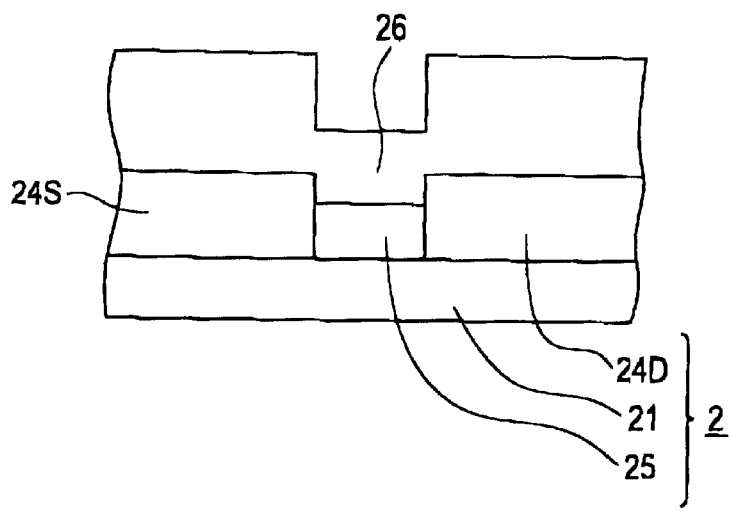

A gate insulating film 26 according to the method of the present invention is formed as shown in FIG. 9. The gate insulating film 26 is formed at a substrate temperature ranging from 120 to 250° C. or lower by the remote plasma CVD apparatus shown in FIG. 2.

Figure 10:
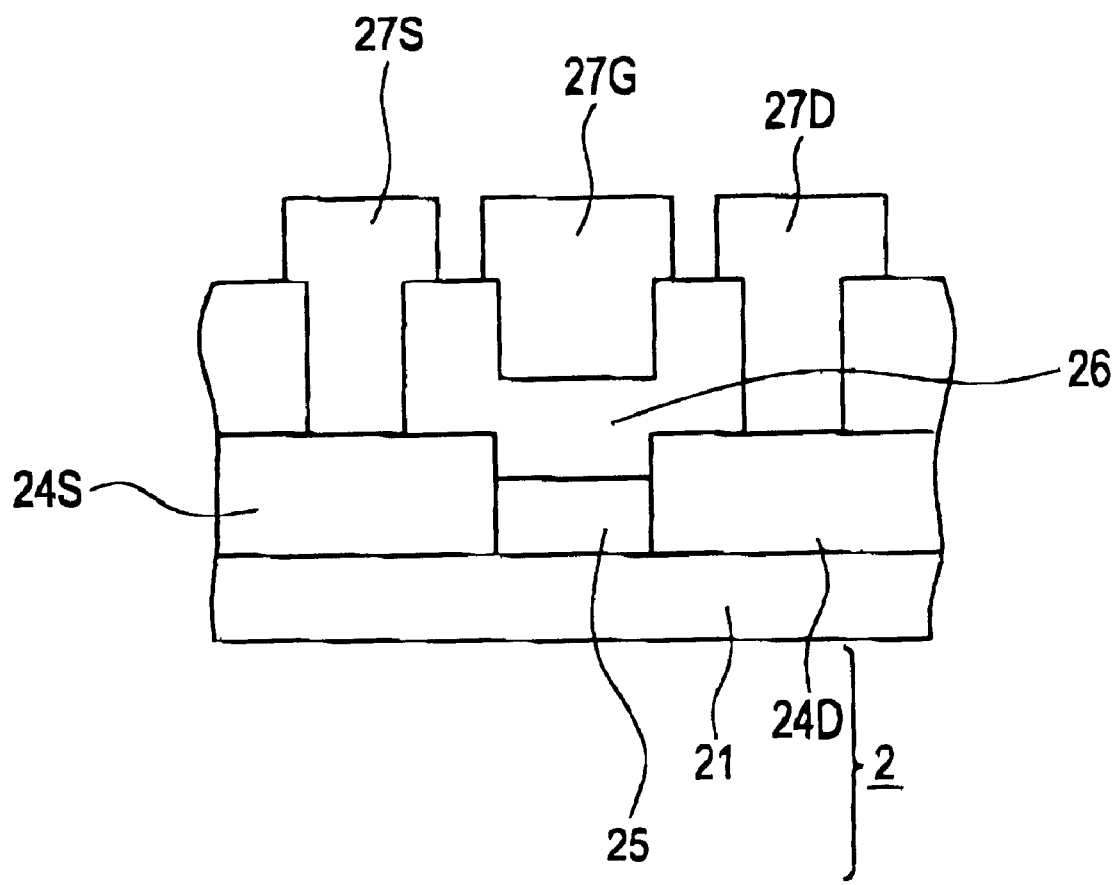

Then, as shown in FIG. 10, electrode contact windows are defined in the source region 24S and the drain region 24D by processing the gate insulating film 26 by photolithography. Source and drain electrodes 27S and 27D are interconnected through these electrode contact windows to the source and drain regions 24S and 24D to form an ohmic-contact. A gate electrode 27G is deposited on the gate-insulating film 26 formed between the source and drain regions 24S and 24D. The source electrode 27S, the drain electrode 27D and the gate electrode 27G can be simultaneously formed such that the whole surface of Al is patterned by photolithography.

Figure 11:
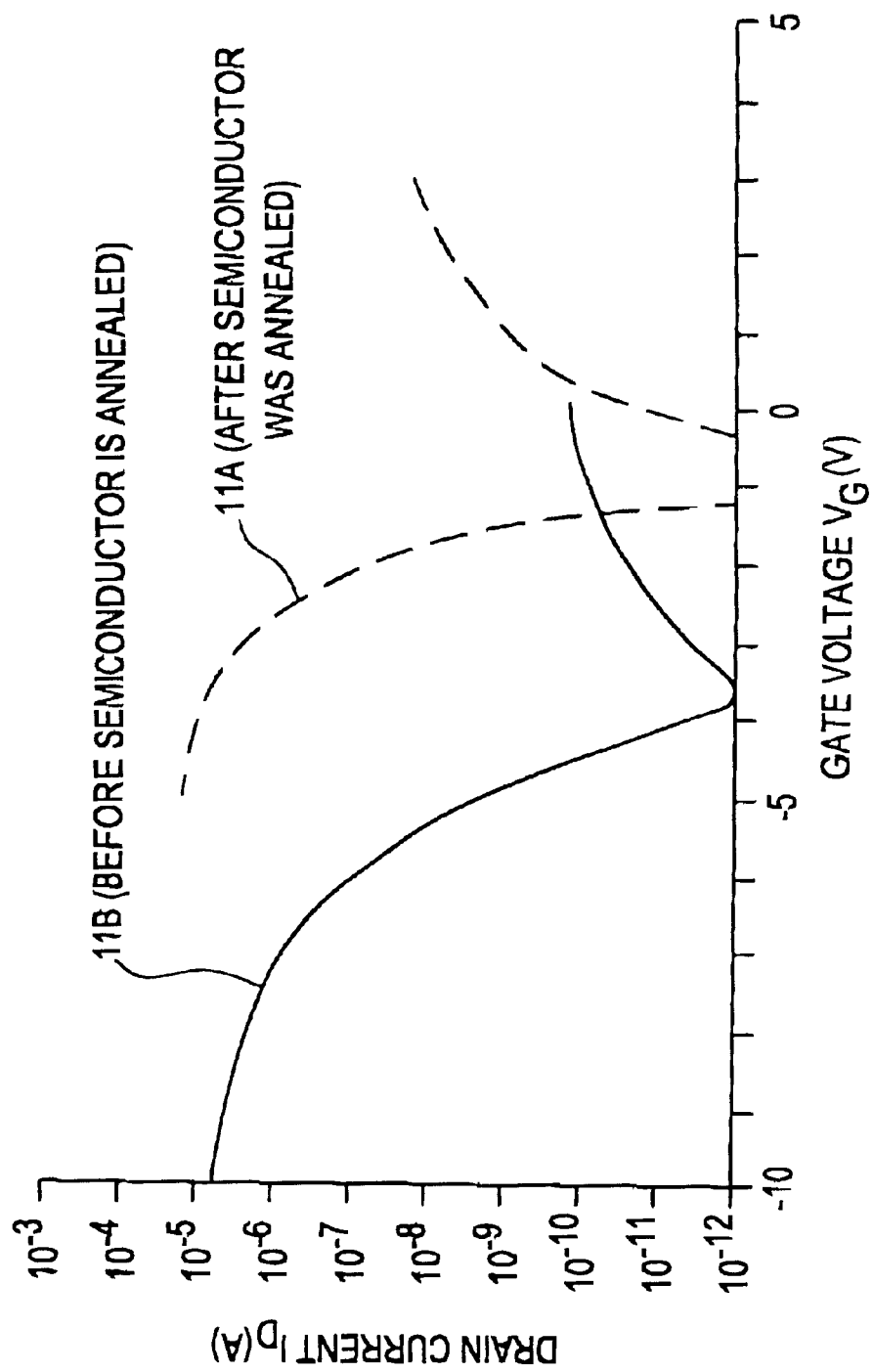
FIG. 11 is a characteristic graph showing measured results of drain current $I_D$-gate voltage $V_G$ characteristics of the TFT manufactured by the manufacturing process according to the present invention.

In the manufacturing process according to the present invention, the TFT thus formed is heated in the vapor atmosphere, i.e., annealed. The TFT was annealed at a temperature of 270° C. for 30 minutes in the atmosphere of vapor having a partial pressure of 50 Torr. FIG. 11 shows measured results of characteristics of drain current Id-gate voltage $V_G$ obtained from the TFT where a gate width W is 10 $\mu$m and a gate length L is 10 $\mu$m when the drain voltage $V_D$ is equal to −1V. In FIG. 11, a curve 11A shows a $I_D$-$V_G$ characteristic curve of the TFT obtained by the manufacturing process according to the present invention. A curve 11B shows a $I_D$-$V_G$ characteristic curve similarly obtained from the TFT which was not yet processed by vapor annealing. Study of comparison of the characteristic curves 11A and 11B shows that the flat-band voltage, i.e., off-voltage of the TFT obtained by the inventive manufacturing process, i.e., TFT produced by vapor annealing was improved from −3.6V to −1.0V.

Similarly, study of comparison of the characteristic curves 11A and 11B in FIG. 11 shows that the on-current of the TFT produced by the inventive manufacturing process was increased about three times from 6.42 $\mu$A obtained when $V_G$=−10V before the TFT is annealed to 18.83 $\mu$A obtained when $V_G$=−5V after the TFT was annealed.

Further, a mobility per unit electric field intensity increased from 60 cm$^2$/Vs to 400 cm$^2$/Vs. A sub-threshold swing value was improved from 0.38 V/decade to 0.15 V/decade. Specifically, according to the inventive manufacturing process, the semiconductor device of not only the bulk-type MIS structure but also of the thin film structure could reduce electric charges of oxide film and density of interface state.

Reduction of the interface state density means that the silicon film formed of the first and second semiconductor layers 22 and 23 serving as the under layer of the insulating film could be reformed. Specifically, the reduction of the interface state density means that a passivation effect can be achieved on the silicon defect, i.e., defects frequently existing on the dangling bond of grain boundary and the interface relative to the insulating film.

Figure 12:
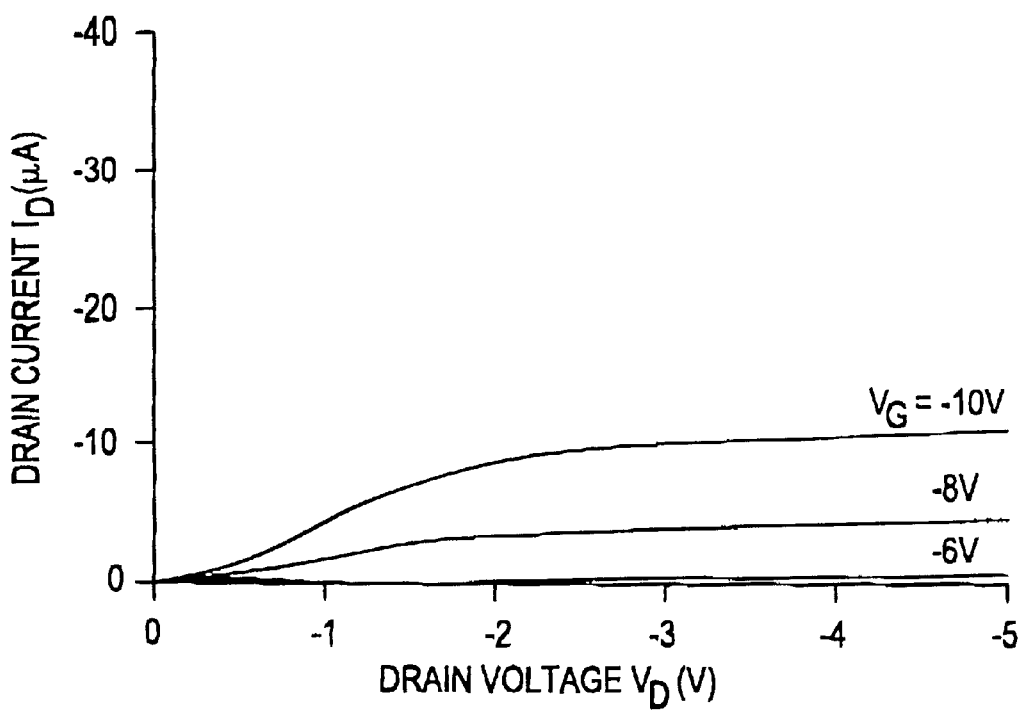
FIG. 12 is a characteristic graph showing measured results of drain current $I_D$-drain voltage $V_D$ characteristics obtained from the TFT manufactured by the manufacturing process according to the present invention before the TFT is annealed in the atmosphere containing a gas of water.
Figure 13:
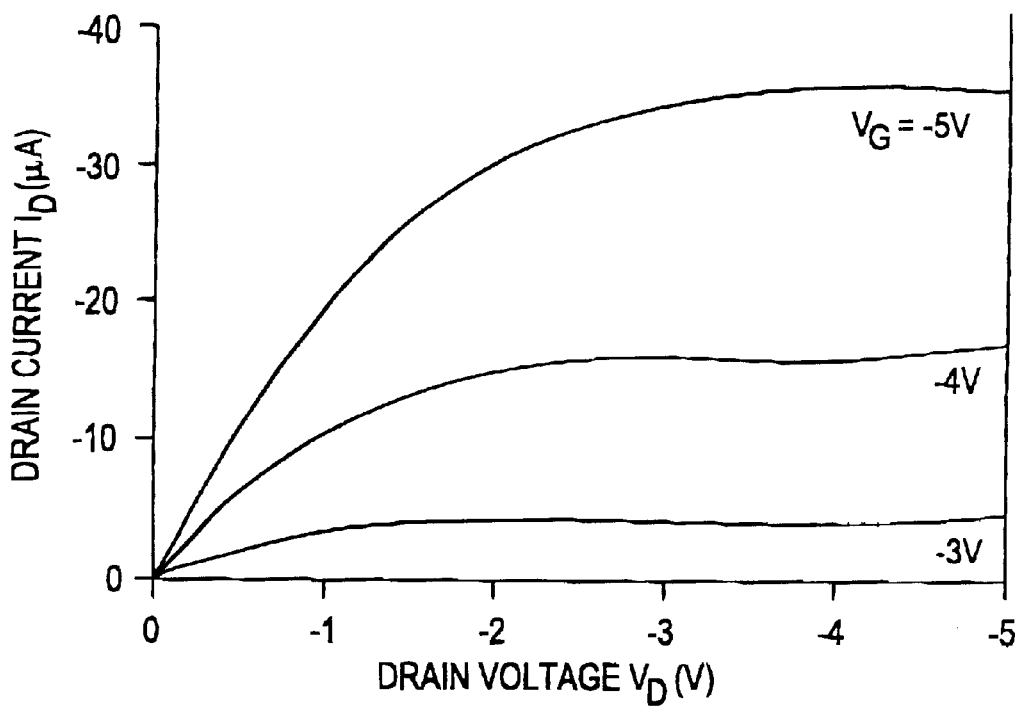
FIG. 13 is a characteristic graph showing measured results of drain current $I_D$-drain voltage $V_D$ characteristics obtained from the TFT manufactured by the manufacturing process according to the present invention after the TFT was annealed in the atmosphere containing a gas of water.

Further, in the manufacturing process according to the present invention, since the semiconductor is reformed, the electrode or interconnection which contacts with the semiconductor can form an ohmic contact satisfactorily. More specifically, FIG. 12 shows measured results of characteristics of drain current $I_D$-drain voltage $V_D$ obtained from the TFT, which was not yet processed by vapor annealing, when the gate width W is 10 $\mu$m and the gate length L is 10 $\mu$m. Study of FIG. 12 shows that electrodes cannot satisfactorily form an ohmic-contact with the source and drain regions in this TFT. FIG. 13 shows measured results of similar characteristics of drain current $I_D$-drain voltage $V_D$ of the TFT which was processed by vapor annealing at the temperature of 270° C. for 30 minutes in the atmosphere having a partial pressure of 50 Torr according to the inventive manufacturing process. Study of comparison of FIGS. 12 and 13 reveals that, according to the inventive manufacturing process, the ohmic contact could be improved, i.e., the semiconductor could be reformed.

The gas used in the plasma CVD for forming the SiO$_2$ insulating film is not limited to the monosilane gas SiH$_4$ serving as silicon raw material and might be a high-order silane gas such as disilane Si$_2$H$_8$. An oxidizing gas is not limited to O$_2$ and might be oxide nitrogen gas such as N$_2$O.

The method of forming the insulating film is not limited to the above-mentioned remote plasma method and the insulating film can be formed by a variety of plasma CVD methods for forming the insulating film. Specifically, the insulating film can be formed by ordinary plasma method, such as DC plasma, RF plasma, microwave plasma, ECR (electron cyclotron resonance) plasma, helicon wave plasma and RF sputtering.

Further, the manufacturing process according to the present invention can be used to obtain a semiconductor device having a silicon thermal oxidation film formed at a temperature under 600° C., semiconductor devices having insulating films formed by low pressure CVD and atmospheric pressure CVD, and a semiconductor having an insulating film formed by electron beam or vacuum deposition based on resistor heating.

The heating means 39 and 7 shown in FIGS. 1 and 2 are not limited to a resistor-type heater and might be a high-frequency induced heating or radiation-type heating such as an infrared ray lamp depending on the arrangement of the semiconductor substrate 2 and the semiconductor substrate holding portion 3.

The method of introducing vapor to effect vapor annealing is not limited to the vacuum suction and might be a method wherein vapor is introduced into the substrate annealing container 31 into which a variety of gases were filled in advance. If gases other than vapor are mixed into the substrate annealing container 31 as described above, then a thermal conductivity within the substrate annealing container 31 is improved and a temperature distribution is reduced. Therefore, it is possible to avoid the disadvantage that the introduced vapor forms a moisture at a locally-low-temperature portion to lower the effect achieved by annealing.

The vapor supplying method might be a so-called bubbling method wherein a variety of carrier gases are immersed into the water in the container portion 35 and carrier gases impregnated with water are supplied into the substrate annealing container 31.

The annealing within the substrate annealing container 31, i.e., vapor annealing can be carried out under the condition that the substrate annealing container 31 is closed or in an air current of carrier gas.

Further, a method of introducing vapor, i.e, gas of water into the substrate annealing container 31 for effecting the vapor annealing might be a method using a spray or a spray type method using a pulse-jet water generated by ultrasonic vibration. According to this spray method, water particles are very small and therefore can be easily changed to gases within the substrate annealing container 31.

A variety of gases, such as oxygen, nitrogen, hydrogen and oxide nitrogen can be satifactorily used as gases mixed with vapor without deteriorating the effects achieved by the vapor annealing. In particular, when oxygen is used, an insulating film having a large dielectric dispersion also can be reformed by annealing using only oxygen. Therefore, it is possible to more effectively reform the semiconductor or the insulating film by using oxygen as the gas to be mixed with vapor.

In that case, the partial pressure is selected to be 1 Torr or greater and less than 10 atmospheric pressures. The reason that the partial pressure is selected to be 1 Torr or greater is that the partial pressure of 1 Torr is required in order to reform the dielectric dispersion of the insulating film by the oxygen. Further, the reason that gases such as nitrogen are mixed with vapor is to prevent a moisture from being produced within the substrate annealing container 31 at its portion where a temperature distribution is small. If the partial pressure is selected to be less than 1 Torr (less than about the same pressure as the vapor pressure), then the above-mentioned effects become small. The reason that the partial pressure is selected to be less than 10 atmospheric pressures is that, if the partial pressure exceeds 10 atmospheric pressures, then the vapor annealing apparatus becomes complex and large enough to protect the substrate annealing container from a large pressure, which is not useful in actual practice. Also, in the area in which the partial pressure of vapor is less than one atmospheric pressure, it becomes possible to reduce an annealing time by increasing an atmospheric pressure. If however them partial pressure of vapor exceeds 10 atmospheric pressures, then the effect that could be achieved when the pressure increases progressively is reduced.

While the present invention is applied to the TFT of the so-called top-gate type structure wherein the gate insulating film and the gate electrode are formed on the upper layer of the channel-forming region 25 shown in FIG. 10 as described above, the present invention is not limited thereto and can be applied to the TFT of a so-called bottom-gate type structure wherein the gate insulating film and the channel-forming region are formed on the gate electrode.

Furthermore, the manufacturing process according to the present invention is not limited to the semiconductor device having the MIS structure and can be applied to a variety of semiconductor devices. The semiconductor that can be reformed is not limited to the Si (silicon) semiconductor and the present invention can be applied to Ge and SiGe solid-solution semiconductors, a laminated thin film semiconductor, such as SiGe super-lattice and single-crystal, amorphous and polycrystalline semiconductors with similar effects being achieved. The insulating film is not limited to the above-mentioned gate insulating film and the present invention can be applied to semiconductor devices having an interlevel insulator, a surface protecting insulating film and a planarization film. The insulating film is not limited to the $SiO_2$ film and the present invention can be applied to semiconductor devices having SiON and SiN insulating films formed at a substrate temperature of less than 600° C. when formed or an insulating film having a laminated structure composed of more than two materials such as $SiO_2$ with similar effects being achieved. Furthermore, the manufacturing process according to the present invention can be also applied to a semiconductor device having an insulating film such as an interlevel insulator based on SOG (spin on glass). Specifically, while a stability of device characteristic is not always maintained due to a defect in the film, i.e., water in these insulating films, when the semiconductor devices of these structures are obtained, it is possible to obtain a semiconductor device having stable characteristics by the manufacturing process according to the present invention.

Figure 14:
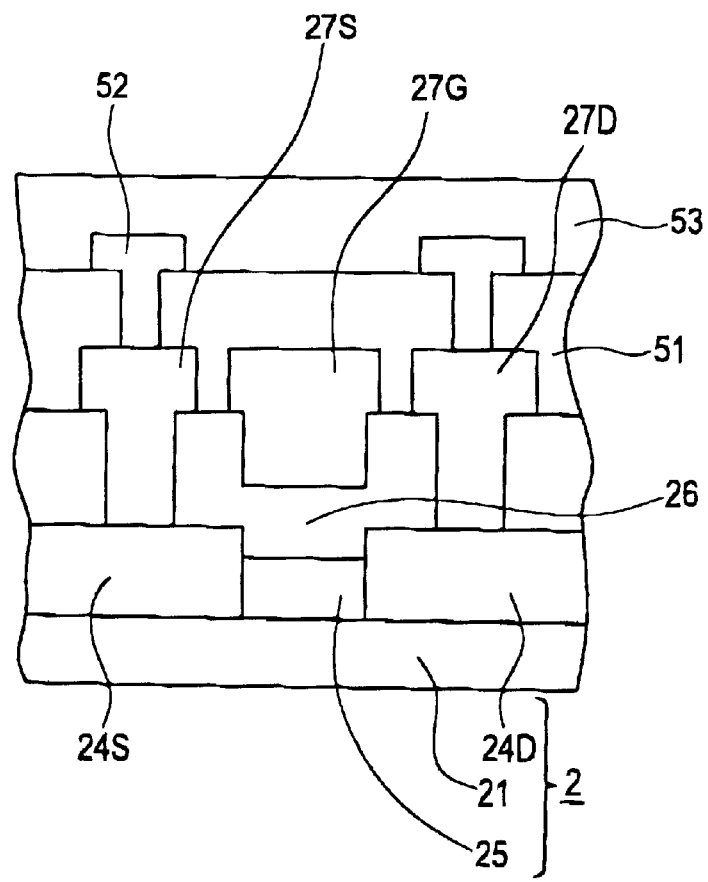
FIG. 14 is a cross-sectional view showing an example of a TFT obtained by the manufacturing process according to the present invention.

FIG. 14 is a cross-sectional view showing an example of such semiconductor device having stable characteristics. The semiconductor device shown in FIG. 14 differs from the semiconductor device shown in FIG. 10 as follows.

In the TFT semiconductor device shown in FIG. 10, before vapor annealing is carried out, an SiN or SOG interlevel insulator 51 is formed on the whole surface. An upper interconnection 52 formed on the interlevel insulator 51 through a contact hole (not shown) defined on the interlevel insulator 51 is electrically contacted with an under layer interconnection, i.e., the source electrode 27S and the drain electrode 27D in the illustrated example to form a multiple-interconnection structure. Then, a surface protecting or planarization insulating film 53 formed of a similar insulating film such as SiN or SOG is formed on the multiple-interconnection structure. Thereafter, a resulting semiconductor is annealed in the above-mentioned atmosphere containing a water (gas). In FIG. 14, like parts corresponding to those of FIG. 10 are marked with the same references and therefore need not be described in detail.

Also in this case, it is possible to obtain the semiconductor device in which not only the gate insulating film 26 but also the interlevel insulator 51 and the planarization insulating film 53 can be stabilized in characteristic.

Figure 15:
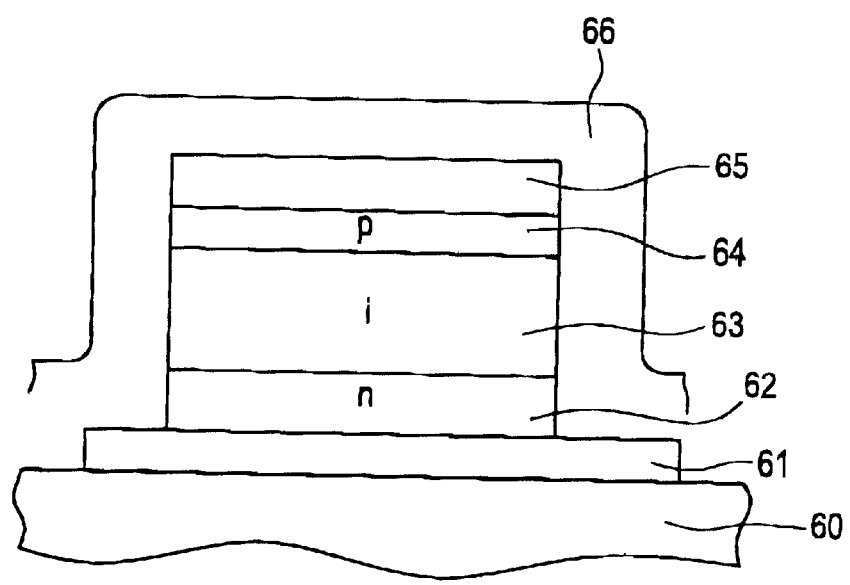
FIG. 15 is a cross-sectional view showing an example of a solar battery obtained by the manufacturing process according to the present invention.

Furthermore, the manufacturing process according to the present invention can be applied to a solar battery formed of any one of amorphous, polycrystalline or single-crystal semiconductor. FIG. 15 is a cross-sectional view showing an example of the solar battery. In this example, as shown in FIG. 15, one electrode 61 is formed on a glass substrate 60, for example. A first semiconductor layer 62 made of an n-type amorphous Si (a-Si), a second semiconductor layer 63 made of a non-doped, i.e., intrinsic a-Si and a third semiconductor layer 64 made of p-type a-Si are sequentially formed on the electrode 61 by plasma CVD, for example. Then, a transparent electrode 65 made of ITO (composite oxide of In and Sn) is deposited on the third semiconductor layer 64. Furthermore, a surface protecting film 66 made of SiN, for example, is formed on the transparent electrode 65. After the surface protecting film 66 was formed on the transparent electrode 65, the resultant semiconductor is annealed in the above-mentioned atmosphere containing vapor. With this arrangement, the semiconductor is reformed and the insulating film was reformed as described above, the transparent electrode 65 can be connected to the semiconductor layer 64 to form a satisfactory ohmic-contact and the surface protecting film 66 can be stabilized.

As set forth, according to the inventive manufacturing process, by annealing in the atmosphere containing gas of water, the semiconductor and the insulating film can be effectively reformed in the annealing at a low temperature under 400° C. Thus, even when the electrode or interconnection is connected to the semiconductor to form an ohmic-contact by reforming the semiconductor and the above ohmic-contact is not always satisfactory, such unsatisfactory ohmic-contact can be reformed into a satisfactory ohmic-contact.

A deterioration of hot electrons can be suppressed in the gate insulating film by reforming the insulating film, i.e., reducing water and OH radical in the insulating film.

Further, since static electric charges caused by defect or impurity in the gate-insulating film can be neutralized and a flat-band voltage deviated to the negative side can be shifted to the 0V side, the n-channel MIS transistor can be avoided from being operated as the depletion type transistor and can be operated in the enhancement state. On the other hand, in a p-channel MIS transistor, a threshold voltage $V_{th}$ can be avoided from increasing with the result that the p-channel MIS transistor can be operated reliably. Therefore, semiconductor devices, such as a CMOS (complementary metal-oxide-semiconductor) can be easily formed as integrated circuits by MIS transistors of two-conductivity type channels.

Further, since fluctuations of device characteristics on the same semiconductor substrate can be reduced, circuits can be formed as integrated circuits more easily.

Furthermore, since characteristics on the interface between the semiconductor and the insulating film can be improved, i.e., the threshold swing value can be reduced, the on-current can be increased, the off-current can be lowered and the threshold voltage $V_{th}$ can be lowered, the resulting integrated circuit can be operated at high speed.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A method of fabricating a semi-conductor device comprising the steps of:

forming a dielectric layer selected from silicon nitride and silicon oxynitride;

annealing the dielectric layer in a water vapor atmosphere and at a temperature which is in the range of about 270 C. and 400 C.

* * * * *